United States Patent [19]

Kraus

[11] 4,181,161

[45] Jan. 1, 1980

[54] METHOD OF PRODUCING A HIGH VACUUM IN A CONTAINER

[75] Inventor: Thaddäus Kraus, Triesen, Liechtenstein

[73] Assignee: Balzers Aktiengesellschaft für Hochvakuumtechnik und Dünne Schichten, Liechtenstein, Liechtenstein

[21] Appl. No.: 951,241

[22] Filed: Oct. 13, 1978

[30] Foreign Application Priority Data

Oct. 20, 1977 [CH] Switzerland ........................ 01278/77

[51] Int. Cl.² .................. B65B 31/00; C23C 13/00
[52] U.S. Cl. .................................... 141/8; 34/92; 118/666; 118/724; 141/65; 427/248 R; 432/205
[58] Field of Search .................... 13/31; 34/92, 48; 118/5, 49, 49.1; 141/4, 8, 65, 66, 82, 7; 313/7; 315/108; 316/18; 427/248 R; 432/205, 220

[56] References Cited

U.S. PATENT DOCUMENTS

| 2,408,614 | 10/1946 | Dimmick | 118/49 |
| 3,009,828 | 11/1961 | Rogers | 118/49 X |
| 3,181,775 | 5/1965 | Herb | 118/49 X |

*Primary Examiner*—Frederick R. Schmidt
*Attorney, Agent, or Firm*—McGlew and Tuttle

[57] ABSTRACT

A method of producing a high vacuum in a container which has limiting walls which define a reaction chamber which is adapted to be evacuated for vacuum processing purposes, and in which gases are sorbed during vacuum operation and the gases are removed subsequently by increasing the temperature of the walls and evacuating the chamber at the same time includes heating the reaction chamber, sensing the underpressure in the reaction chamber and controlling the heating of the chamber in accordance with the sensed pressure in a manner such that the underpressure remains within a preselected upper and lower limit value until a predetermined temperature of the walls is attained.

5 Claims, 2 Drawing Figures

METHOD OF PRODUCING A HIGH VACUUM IN A CONTAINER

FIELD AND BACKGROUND OF THE INVENTION

This invention relates to vacuum container operations in general and, in particular, to a new and useful method of producing a high vacuum in a container, particularly of a type which is adapted to be used for processes requiring vacuum-operating conditions.

DESCRIPTION OF THE PRIOR ART

High vacuum is provided primarily in all processes which are very susceptible to the action of gaseous substances, such as, in the deposition of thin layers by evaporation. Therefore, the collision rate per unit surface (DIN 28.400, sheet 1) of the residual gas, particularly water vapor, in almost all instances, strongly influences the properties of such products. If the process is carried out at too high a collision rate, in order to save pumping time and suction work, the risk of exceeding tolerances or of obtaining a higher product rejection rate must be taken into account. Accordingly, for reasons of economy, the processes are preferably carried out at unit surface collision rates which are just at the limit of a still acceptable risk.

For a substantial part, the risk is due to the fact that the unit surface collision rate of the residual gas cannot be controlled directly on the surface to be treated, but must be derived from the measured number of particles per unit volume, the pressure, or other vacuum quantities at another measured location, with the understanding that the correlation may vary. Therefore, a satisfactory reproducibility of the results might be supported by the following measures: keeping the temperature constant, adjusting the process to a definite, low number of particles per unit volume, and limiting the suction capacity (volumetric rate of flow) of the connected pumping system. A strict observation of such conditions is uneconomical, however, since it requires very long pumping times.

On the other hand, an attempt to obtain a reduced number of particles per unit volume in a shorter time, by increasing the suction capacity of the pumping system, frequently results in an increased proportion of rejects. This is due to the fact that the local differences between the number of particles per unit volume and the collision rate per unit surface in the container increase with the increasing suction capacity. That is, the correlation between the unit surface collision rate and the unit volume particle number is strongly changed by very small differences, for example, of the spatial arrangement of the built-in equipment, the temperature distribution, or the temperature variation. An increased proportion of rejects may also be observed if an attempt is made to obtain a shorter pumping time by heating the container during the evacuation in a well known manner. This is probably due to an increase of the differences between the residuals of sorbed vapor at the various locations of the inside walls of the container.

These vapor residuals depend, on the one hand, on the temperature, the vapor content, and the duration of the air action and, on the other hand, on the variation in time and space of the temperature and pressure during the evacuation. Even very small variations of these intervening quantities may also result in an uncontrollable variation of the unit surface collision rate affecting the reproducibility of the feature values of the products.

SUMMARY OF THE INVENTION

The present invention is directed to a method of increasing the productivity of vacuum processes, either by reducing the pumping time, or by improving the reproducibility of the feature values of the products. The invention begins with the knowledge that, in the prior art methods of producing a high vacuum by heating the inside walls of the container under simultaneous evacuation, the heating effect or temperature have been controlled in accordance with a predetermined program, in most cases, by simply keeping the heating effect constant during a predetermined period of time, so that the differences in desorption given by the respective initial conditions have not been sufficiently taken into account. That is, the effect produced was that the temperature would rise slowly with a gradual reduction of the increase to approach a limit value asymptotically. The result was a quite considerable extension of the pumping time. In contradistinction thereto, the inventive method of producing a high vacuum in a container for carrying out vacuum processes, in which sorbed gases are removed by increasing the temperature of the walls limiting the working space under simultaneous evacuation, provides that, upon reaching a predetermined underpressure, the heating of the walls is controlled to keep the underpressure between preselected upper and lower limit values until a predetermined temperature of the walls is attained.

Such a heating control, by which the pressure variations during the heating are reduced as compared to the prior art and a definite temperature is maintained for the end of the heating process, results not only in a shortened pumping time, but surprisingly, often in a substantially improved reproducibility of the feature values of the products as well.

In a surprising manner, the pressure and final temperature have proven to be particularly suitable as adjusting values for a two-dimensional optimization to obtain a maximum productivity.

To obtain satisfactory reproducibility, short setting times of the control and not too large pressure limits within which the actual value of the pressure can vary are sought.

Accordingly, it is an object of the invention to provide a method of producing a high vacuum in a container having limiting walls which define a reaction chamber which is evacuated for vacuum processing purposes, and in which gases are sorbed in the container during vacuum operation and the gases are subsequently removed by increasing the temperature of the walls while the container is evacuated and in which heating of the chamber is carried out and the underpressure is sensed in the reaction chamber and, wherein, the heating is controlled such that the underpressure remains within a preselected upper and lower limit value until a predetermined temperature of the walls is attained.

A further object of the invention is to provide a method or producing a high vacuum in a container which is simple in concept, inexpensive to carry out and is very effective.

The various features of novelty which characterize the invention are pointed out with particularity in the claims annexed to and forming a part of this disclosure. For a better understanding of the invention, its operat-

DESCRIPTION OF THE PREFERRED EMBODIMENTS

Figure 1:
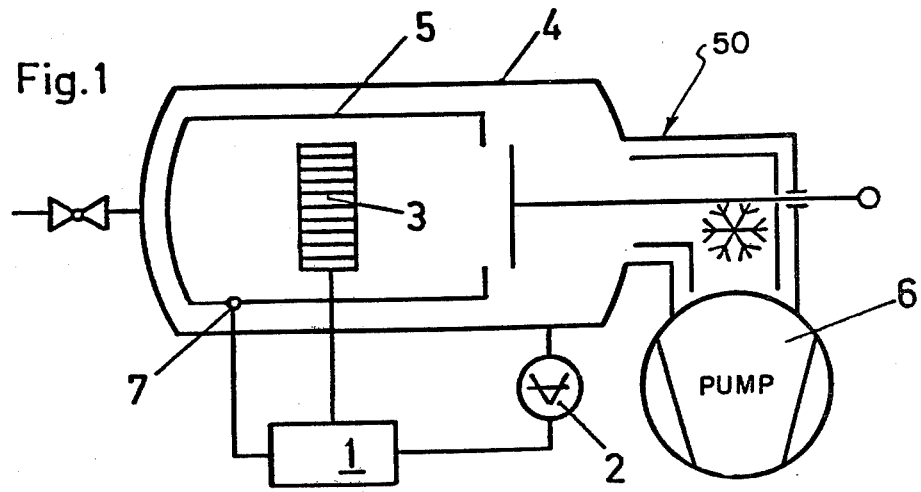
FIG. 1 is a schematic view of a container for use with processes which require evacuation of the container.

Referring to the drawings in particular, the invention embodied therein, comprises an apparatus, generally designated 50, which is employed for vacuum processes, for example, for coating substrates under vacuum sputtering conditions. The invention provides means for increasing the productivity of the vacuum processes by reducing the pumping time for evacuating a container 4 of such apparatus in which gases are sorbed on the wall surfaces thereof during the carrying out of the process. In accordance with the method of the invention, the gases are removed by increasing the temperature of the walls, limiting the working space under simultaneous evacuation and controlling the heating of the walls to keep the underpressure between preselected upper and lower limit values until a predetermined temperature of the walls is attained. It has been found that the upper limit value should equal double the lower limit value at the most.

Upon reaching the predetermined temperature, the heating is either switched off or the inside walls are cooled. An ionization gauge is used as a pressure sensor for the control.

With the aid of a vacuum pressure sensor 2, a controller 1 controls a heating element 3 accommodated in a container 4 to the effect that within the working space limited by a casing 5, the pressure which is maintained by a corresponding control of the wall temperature and, thus, of the gas release, by desorption in cooperation with a pump unit 6, is kept at a substantially constant value or only varies about an average value which is determined by the set desired value. A temperature sensor 7 is provided at casing 5, by means of which the heating is switched off through controller 1 as soon as the predetermined final temperature is attained. The temperature sensor might be omitted to simplify the arrangement, and the heating might follow a predetermined program. However, in such a case, the unequal initial conditions of, for example, the air humidity, would no longer be as well balanced and might disadvantageously affect the reproducibility of the feature values of the products. The two independent variables, namely, the pressure and the final temperature or duration of the heating, can be set in a manner such that a target value, for example, the productivity depending on the duration of the evacuation process and the rejects proportion of the products, assumes a maximum.

Figure 2:
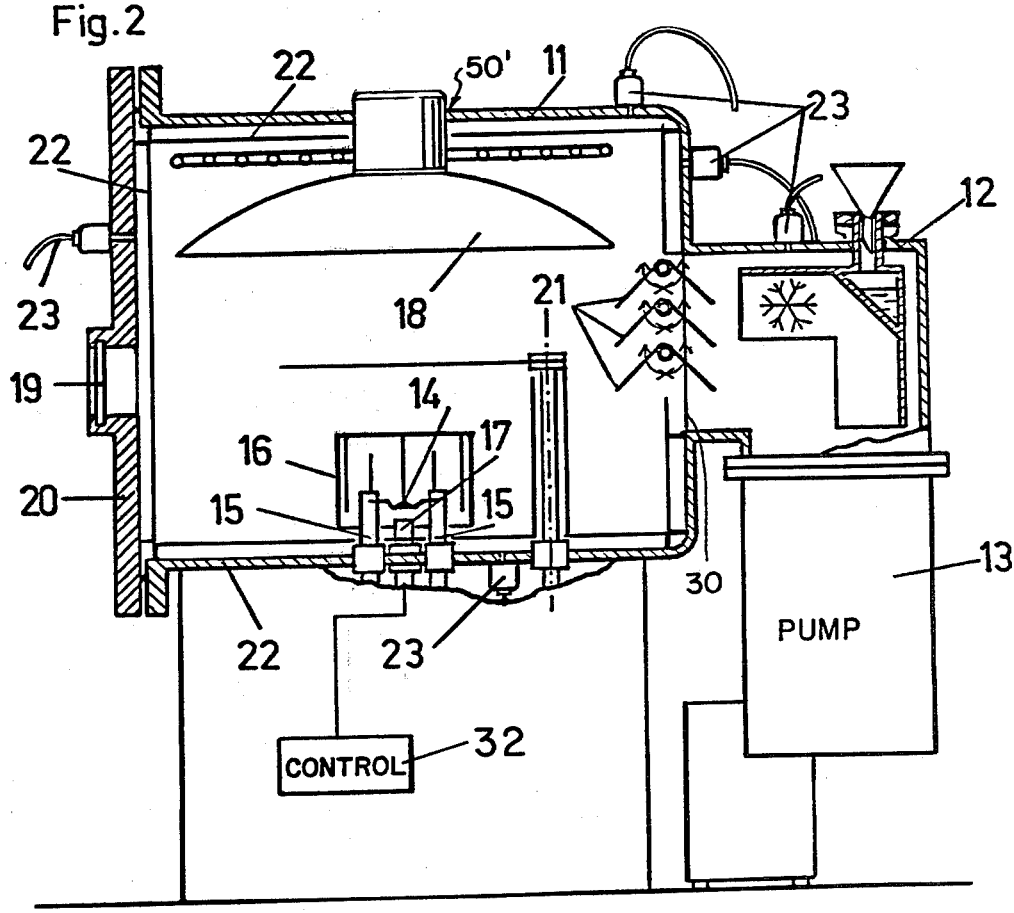
FIG. 2 is a view similar to FIG. 1 of another embodiment of the invention.

FIG. 2 shows an example of an embodiment of an evaporation apparatus 50' for producing thin layers, which is suitable for carrying out the inventive method. The container, whose wall is indicated at 11, is connected to a pump 13 through an exhaust connection 12. The container accommodates an evaporation source 14 which is supplied with energy through vacuum-tight leads 15. In addition, the evaporation source is surrounded by a second heating element 16, designed, for example, as a cylindrical carbon heating body, which is supported by a plurality of circumferentially spaced leads 17 and supplied with heating current. Only one of the leads 17 is visible in FIG. 2.

FIG. 2 further shows a rotary spherical support 18 for the substrates, a door 20 of the container provided with an inspection glass 19, and a screen 21 in front of an exhaust opening 30. As the apparatus is opened and vapor-containing air has access to the inside walls, the walls sorb a certain amount of vapor. Upon closing the apparatus to cause a desorption, the inside walls are heated by means of heating element 16 and the vapor desorbed from the walls is evacuated, while controlling the pressure in the working space in the inventive manner, by means of a control 32, as described in connection with FIG. 1. As soon as a predetermined temperature is attained, the heating is switched off, whereupon, the inside walls cool down and the pressure drops rapidly.

This advantage of the invention produces its effect quite particularly in containers having their inside walls covered by thin-walled masking sheets 22, as shown in FIG. 2, particularly, if a protective gas is introduced into the intermediate space between the container wall 11 and the sheets 22 through valves 23 upon opening the apparatus. In such evaporation apparatus, due to the low thermal capacity of the masking sheets, the temperature can be varied very rapidly so that the time needed for an evacuation and evaporation cycle can be substantially reduced.

For example, during an evacuation of the described evaporator in order to produce magnesium fluoride layers, the heating effect of the heating element was controlled in such a way that a constant partial pressure of the desorbed water vapor of $0.013 \text{ N/m}^2$ ($1.10^{-4}$ torr) was obtained. After a heating time of $8\frac{1}{2}$ minutes per average, the final temperature of 117° C. was reached. After a cooling time of 17 seconds, the pressure dropped to $0.0013 \text{ N/m}^2$ ($1.10^{-5}$ torr). The total evacuation time averaged to $15\frac{1}{2}$ minutes. To obtain the same feature values of the magnesium fluoride layers with an equal reproducibility, but by evacuation at a constant temperature, with the same evaporator, about 34 minutes were necessary, thus, more than twice the time.

The advantage of the inventive method, however, is not only the possibility of reducing the pumping time, but also to provide better reproducibility of the feature values, as compared to non-isobaric heating methods.

By "feature values of the products" are to be understood within the context of this specification, the quantitative characteristics, such as, the index of refraction, hardness, etc., specific of the properties of a product.

While specific embodiments of the invention have been shown and described in detail to illustrate the application of the principles of the invention, it will be understood that the invention may be embodied otherwise without departing from such principles.

What is claimed is:

1. A method of improving the efficiency or reproductability of the treating of products by producing a high vacuum in a container having limiting walls defining a reaction chamber which chamber is adapted to be evacuated for vacuum processing purposes and in which gases are sorbed in the container during vacuum operation and the sorbed gases are subsequently removed by increasing the temperature of the walls while the reaction chamber is evacuated comprising, heating the walls of the chamber while the chamber is being evacuated, sensing the under pressure in said reaction chamber during the evacuation, and controlling the heating of the walls in accordance with the sensed pressure in a manner such that the underpressure remains within a preselected upper and lower limit value until a predetermined temperature of the walls is attained.

2. A method of producing a high vacuum in a container, as claimed in claim 1, wherein the upper limit value is limited to double that of the lower limit value at most.

3. A method of producing a high vacuum in a container, as claimed in claim 1, wherein, upon reaching the predetermined temperature, the heating is switched off.

4. A method of producing a high vacuum in a container, as claimed in claim 1, wherein, upon reaching a predetermined temperature, the inside walls are cooled.

5. A method of producing a high vacuum in a container, as claimed in claim 1, using an ionization gauge for sensing the pressure.

* * * * *